(12) United States Patent
Wu et al.

(10) Patent No.: US 11,791,275 B2
(45) Date of Patent: Oct. 17, 2023

(54) SEMICONDUCTOR DEVICE AND METHOD OF MANUFACTURING

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 145 days.

(21) Appl. No.: 16/932,364

(22) Filed: Jul. 17, 2020

(65) Prior Publication Data

US 2021/0202396 A1 Jul. 1, 2021

Related U.S. Application Data

(60) Provisional application No. 62/954,212, filed on Dec. 27, 2019.

(51) Int. Cl.
| | | |
|---|---|---|
| *H01L 23/538* | (2006.01) | |
| *H01L 23/00* | (2006.01) | |
| *H01L 23/498* | (2006.01) | |
| *H01L 25/18* | (2023.01) | |
| *H01L 25/00* | (2006.01) | |
| *H01L 21/48* | (2006.01) | |

(52) U.S. Cl.
CPC ...... *H01L 23/5389* (2013.01); *H01L 21/4853* (2013.01); *H01L 21/4857* (2013.01); *H01L 23/49811* (2013.01); *H01L 23/49833* (2013.01); *H01L 23/5383* (2013.01); *H01L 23/5385* (2013.01); *H01L 24/16* (2013.01); *H01L 25/18* (2013.01); *H01L 25/50* (2013.01); *H01L 2224/16225* (2013.01)

(58) Field of Classification Search
CPC ............. H01L 23/5389; H01L 23/5383; H01L 23/5385; H01L 23/49833; H01L 25/50; H01L 21/4857
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| (Continued) | | |

*Primary Examiner* — Michele Fan
(74) *Attorney, Agent, or Firm* — Slater Matsil, LLP

(57) ABSTRACT

Semiconductor devices and methods of forming the semiconductor devices are described herein that are directed towards the formation of a system on integrated substrate (SoIS) package. The SoIS package includes an integrated fan out structure and a device redistribution structure for external connection to a plurality of semiconductor devices. The integrated fan out structure includes a plurality of local interconnect devices that electrically couple two of the semiconductor devices together. In some cases, the local interconnect device may be a silicon bus, a local silicon interconnect, an integrated passive device, an integrated voltage regulator, or the like. The integrated fan out structure may be fabricated in wafer or panel form and then singulated into multiple integrated fan out structures. The SoIS package may also include an interposer connected to the integrated fan out structure for external connection to the SoIS package.

20 Claims, 14 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2017/0084596 A1* | 3/2017 | Scanlan | H01L 21/4882 |
| 2017/0263518 A1* | 9/2017 | Yu | H01L 23/5389 |
| 2018/0068978 A1* | 3/2018 | Jeng | H01L 25/0652 |
| 2018/0102311 A1* | 4/2018 | Shih | H01L 21/486 |
| 2018/0151530 A1* | 5/2018 | Chen | H01L 24/19 |
| 2018/0358298 A1* | 12/2018 | Zhai | H01L 23/5386 |
| 2020/0105719 A1* | 4/2020 | Li | H01L 25/0652 |
| 2021/0111125 A1* | 4/2021 | Chen | H01L 24/08 |
| 2021/0134757 A1* | 5/2021 | Gandhi | H01L 21/565 |

* cited by examiner

SEMICONDUCTOR DEVICE AND METHOD OF MANUFACTURING

PRIORITY CLAIM AND CROSS-REFERENCE

This application claims the benefit of U.S. Provisional Application No. 62/954,212, entitled: "Semiconductor Device and Method of Manufacturing," filed on Dec. 27, 2019, which application is hereby incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures (e.g., System-in-Package (SiP)) provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
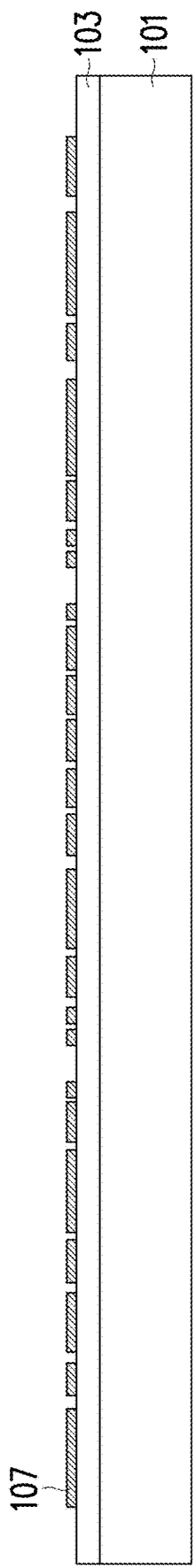
FIGS. 1 through 8 illustrate the cross-sectional views of intermediate stages in the formation of a device connection structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, this figure illustrates a cross-sectional view of forming a redistribution layer (RDL) over a first carrier substrate 101 in an intermediate stage of forming a packaged semiconductor device, according to some embodiments. According to some embodiments, the first carrier substrate 101 has a first release film 103 coating the top surface of the first carrier substrate 101. In some embodiments, the first carrier substrate 101 is formed of a transparent material, and may be a glass carrier, a ceramic carrier, an organic carrier, or the like. The first release film 103 may be formed of a Light-To-Heat-Conversion (LTHC) coating material applied to the first carrier substrate 101 in a coating process. Once applied, the LTHC coating material is capable of being decomposed under the heat of light/radiation (such as laser), and hence can release the first carrier substrate 101 from the structure formed thereon.

FIG. 1 further illustrates the formation of the redistribution traces 107 over the first release film 103. According some embodiments, the redistribution traces 107 may include redistribution lines, micro-bump pad plating, combinations, or the like. The redistribution traces 107 may be formed by initially forming a metal seed layer over the first release film 103. The seed layer may include an adhesion layer and a copper-containing layer in accordance with some embodiments. The adhesion layer may be formed of titanium, titanium nitride, tantalum, tantalum nitride, or the like. The copper-containing layer may be formed of substantially pure copper or a copper alloy. The metal seed layer may be formed using a Physical Vapor Deposition (PVD), a Plasma Enhance Chemical Vapor Deposition (PECVD), an Atomic Layer Deposition (ALD), or the like. Once the metal seed layer has been formed, a plating mask (e.g., a photo resist) may be formed over the metal seed layer with openings patterned into the plating mask to expose some portions of metal seed layer. Next, the redistribution traces 107 are formed in openings of the plating mask, for example, using an electro-chemical plating technique. The redistribution traces 107 may be formed of copper, aluminum, nickel, palladium, alloys thereof, combinations, or the like.

After the redistribution traces 107 have been formed, the plating mask is removed e.g., by ashing or a chemical stripping process, such as using oxygen plasma or the like, and the underlying portions of metal seed layer are exposed. Once the plating mask has been removed, the exposed portions of the metal seed layer are etched away.

Figure 2:
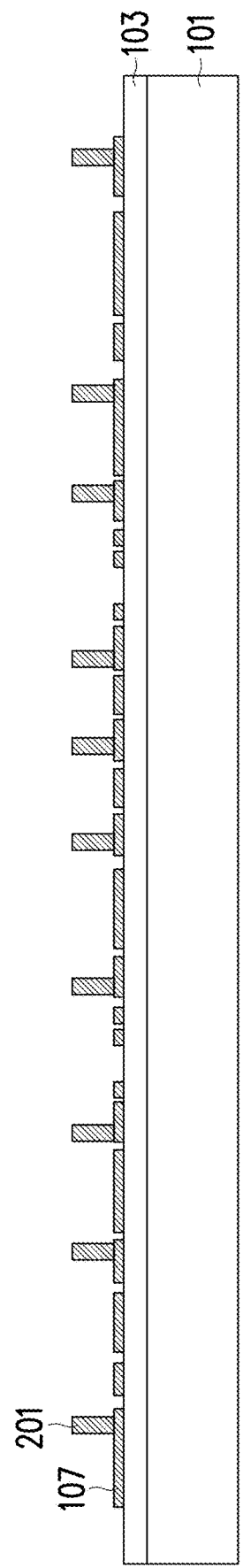

Turning to FIG. 2, through-molding vias (TMVs) 201 are formed over the redistribution traces 107, in accordance with some embodiments. In an embodiment, the TMVs 201 may be formed by initially depositing a photoresist (not shown) over the redistribution traces 107. Once the photoresist has been formed, it may be patterned to expose those portions of the redistribution traces 107 that are located where the TMVs 201 will subsequently be formed. The patterning of the photoresist may be done by exposing the photoresist in desired locations of the TMVs 201 and developing the photoresist to either remove the exposed portions or the un-exposed portions of the photoresist.

Once the photoresist has been patterned, a conductive material may be formed on the redistribution traces 107. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form the TMVs 201. Once the conductive material has been formed, the photoresist may be removed through a suitable removal process such as an ashing process or a chemical stripping process, such as using oxygen plasma or the like. In some embodiments, the TMVs 201 may have a height that is between about 5 µm and about 100 µm. However, any suitable height may be used for the TMVs 201.

Figure 3:
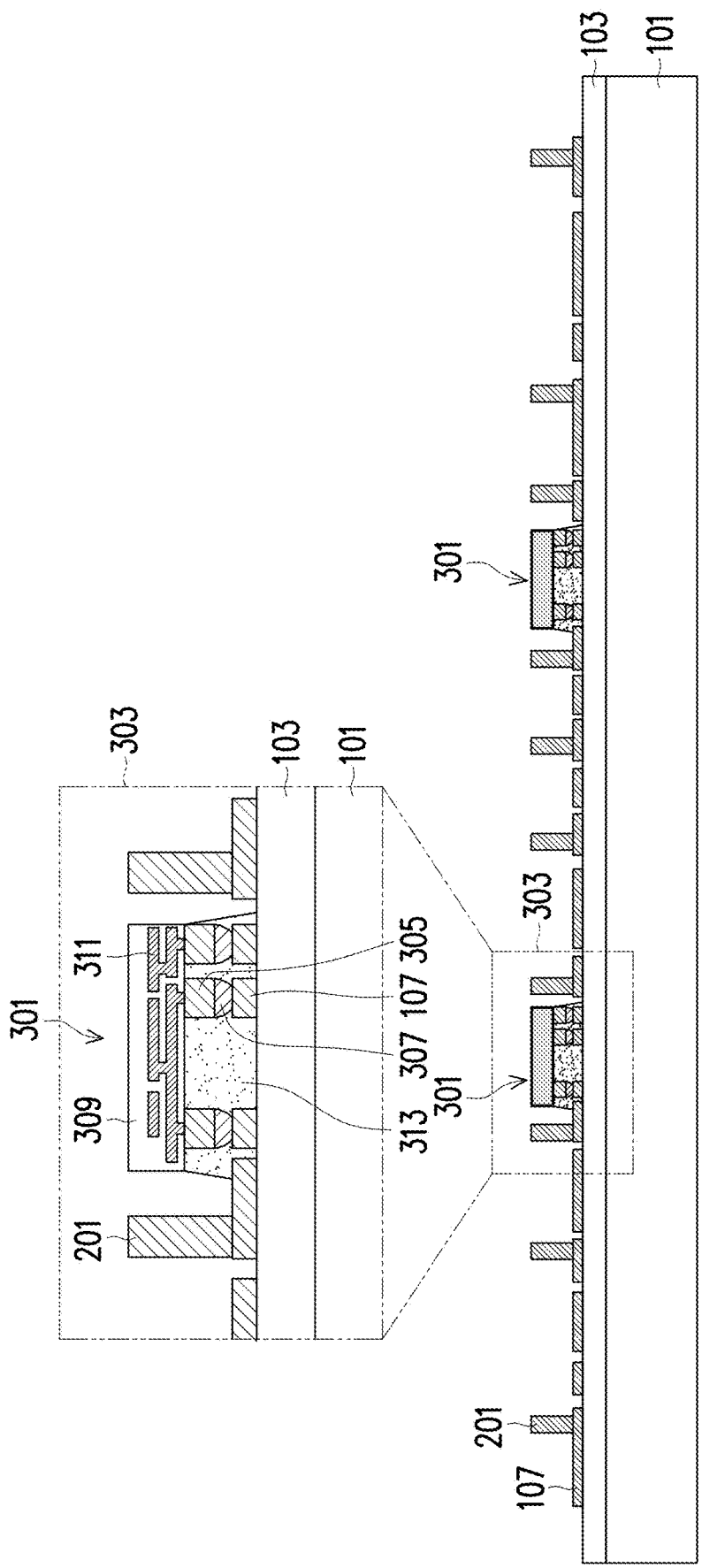

Turning to FIG. 3, this figure illustrates the placement and attachment of interconnect devices 301 (e.g., local silicon interconnects (LSI), or the like) to the redistribution traces 107, according to some embodiments. In some embodiments the interconnect devices 301 may be devices such as local silicon interconnects (LSI), silicon buses (Si-bus), integrated voltage regulators (IVRs), integrated passive devices (IPDs), static random access memory (SRAM), combinations of these, or the like. However, any suitable devices may be utilized.

FIG. 3 further shows two of the interconnect devices 301 attached to the redistribution traces 107, but in other embodiments, only one or more than two interconnect devices 301 may be attached. The attached interconnect devices 301 may include multiple of similar ones of the interconnect devices 301 and/or more than one type of the interconnect devices 301. In some embodiments, other types of devices may be attached to the redistribution traces 107 in addition to the interconnect devices 301.

FIG. 3 further illustrates a section 303, in a magnified view, of the interconnect device 301 after attachment. In some embodiments, the interconnect devices 301 comprise conductive connectors 305, which may be used to make electrical connections to the interconnect devices 301. The interconnect devices 301 shown in FIG. 3 have conductive connectors 305 formed on a single side of each of the interconnect devices 301, but in some embodiments, the interconnect devices 301 may have conductive connectors 305 formed on both sides. In some embodiments, a solder material 307 is formed on each of the conductive connectors 305 prior to attachment.

In some embodiments, the conductive connectors 305 comprise metal pads or metal pillars (such as copper pillars). The conductive connectors 305 may include a conductive material such as solder, copper, aluminum, gold, nickel, silver, palladium, tin, the like, or a combination thereof. In some embodiments, the metal pillars may be solder-free and/or have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the pitch of the conductive connectors 305 may be between about 20 µm and about 80 µm, and the height of the conductive connectors 305 may be between about 2 µm and about 30 µm.

In some embodiments, the solder material 307 formed on the conductive connectors 305 may be ball grid array (BGA) connectors, solder balls, controlled collapse chip connection (C4) bumps, micro bumps (e.g., µbumps), electroless nickel-electroless palladium-immersion gold technique (ENEPIG) formed bumps, or the like. The solder material 307 may include a conductive material such as solder, copper, aluminum, gold, nickel, silver, palladium, tin, the like, or a combination thereof. In some embodiments, the solder material 307 is formed by initially forming a layer of solder through evaporation, electroplating, printing, solder transfer, ball placement, or the like. Once a layer of solder has been formed on the conductive connectors 305, a reflow may be performed in order to shape the material into the desired shapes.

The interconnect devices 301 may be placed on the first carrier substrate 101, for example, using e.g., a pick-and-place process. In some embodiments, once the solder material 307 of the interconnect devices 301 is in physical contact with the redistribution traces 107, a reflow process may be performed to bond the solder material 307 to the redistribution traces 107 and thus attach the interconnect devices 301 to the first carrier substrate 101.

However, while the above described process describes using a solder bonding technique in order to connect the interconnect devices 301, this is intended to be illustrative and is not intended to be limiting. Rather, any suitable method of bonding, such as metal-to-metal bonding, hybrid bonding, combinations of these, or the like, may be utilized to connect the interconnect devices 301. All such methods are fully intended to be included within the scope of the embodiments.

According to some embodiments, each of the interconnect devices 301 may comprise one or more layers of electrical routing 311 (e.g., metallization patterns, metal lines and vias, redistribution layers (RDLs), or the like) formed in and/or over a substrate 309 that electrically couple two or more of conductive connectors 305 to one another. In some embodiments, the interconnect devices 301 are used to form interconnections or additional routing between other devices in a package, such as semiconductor devices, dies, chips, or the like, as discussed in greater detail below. In some embodiments, an interconnect device 301 comprises one or more active devices (e.g., transistors, diodes, or the like) and/or one or more passive devices (e.g., capacitors, resistors, inductors, or the like). However, in other embodiments, an interconnect device 301 includes the one or more layers of the electrical routing 311 and is substantially free of active or passive devices. In some embodiments, the interconnect devices 301 may have thicknesses (excluding the conductive connectors 305 or solder material 307) that is between about 10 µm and about 100 µm, and the interconnect devices 301 may have lateral dimensions between about 2 mm by 2 mm and about 80 mm by 80 mm, such as about 2 mm by 3 mm or 50 mm by 80 mm. However, the interconnect devices 301 may have any suitable lateral dimensions.

The interconnect devices 301 may be formed using applicable manufacturing processes. The substrate 309 may be, for example, a semiconductor substrate, such as silicon, which may be doped or undoped, and which may be a silicon wafer or an active layer of a semiconductor-on-insulator (SOI) substrate, or the like. The substrate 309 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The electrical routing 311 may be formed of alternating layers of dielectric (e.g., low-k dielectric material) and conductive material (e.g., copper) with vias interconnecting the layers of conductive material. The electrical routing 311 of the interconnect devices 301 may be formed of any suitable conductive material using any suitable process. In some embodiments, a damascene process is utilized in which the respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, tantalum, tantalum nitride, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trenches by electroplating. A chemical mechanical planarization (CMP) may be used to remove excess conductive material from a surface of the respective dielectric layer and to planarize the surface for subsequent processing.

In some embodiments, the electrical routing 311 of the interconnect devices 301 may comprise fine-pitch RDLs having a pitch less than about 1 µm. The fine-pitch RDLs may be formed, for example, using single damascene and/or dual damascene processes, described above. By forming the electrical routing 311 having a fine pitch, the density of the electrical routing 311 in the interconnect devices 301 may be increased, thus improving the routing ability of the interconnect devices 301. In some cases, a higher density of electrical routing 311 in the interconnect devices 301 may allow a smaller amount of routing to be formed elsewhere in a package. This can decrease the size of a package, reduce the processing cost of a package, or improve performance by reducing the routing distances within a package. In some cases, the use of a fine-pitch formation process (e.g., a damascene or duel damascene process) may allow for improved conduction and connection reliability within the interconnect devices 301. In some cases, during high-speed operation (e.g., greater than about 2 Gbit/sec), electrical signals may be conducted near the surfaces of conductive components. Fine-pitch routing may have less surface roughness than other types of routing, and thus can reduce resistance experienced by higher-speed signals and also reduce signal loss (e.g., insertion loss) during high-speed operation. This can improve the performance of high-speed operation, for example, of Serializer/Deserializer ("SerDes") circuits or other circuits that may be operated at higher speeds.

Furthermore, once the interconnect devices 301 have been attached, a first underfill 313 can be deposited in the gap between each of the interconnect devices 301 and the first release film 103. The first underfill 313 may be a material such as a molding compound, an epoxy, an underfill, a molding underfill (MUF), a resin, or the like. The first underfill 313 can protect the conductive connectors 305 and provide structural support for the interconnect devices 301. In some embodiments, the first underfill 313 may be cured after deposition.

Figure 4:
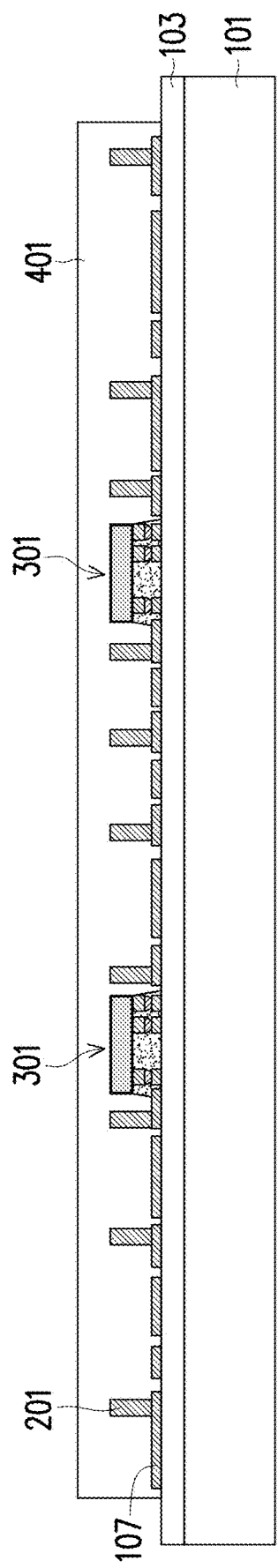

FIG. 4 illustrates an encapsulation of the interconnect devices 301 and the TMVs 201 using an encapsulant 401, in accordance with some embodiments. The encapsulation may be performed using a molding device or the encapsulant 401 may be deposited using another technique. The encapsulant 401 may be, for example, a molding compound such as a resin, polyimide, PPS, PEEK, PES, epoxy molding compound (EMC), another material, the like, or a combination thereof. The encapsulant 401 may surround and/or cover the interconnect devices 301 and TMVs 201.

Figure 5:
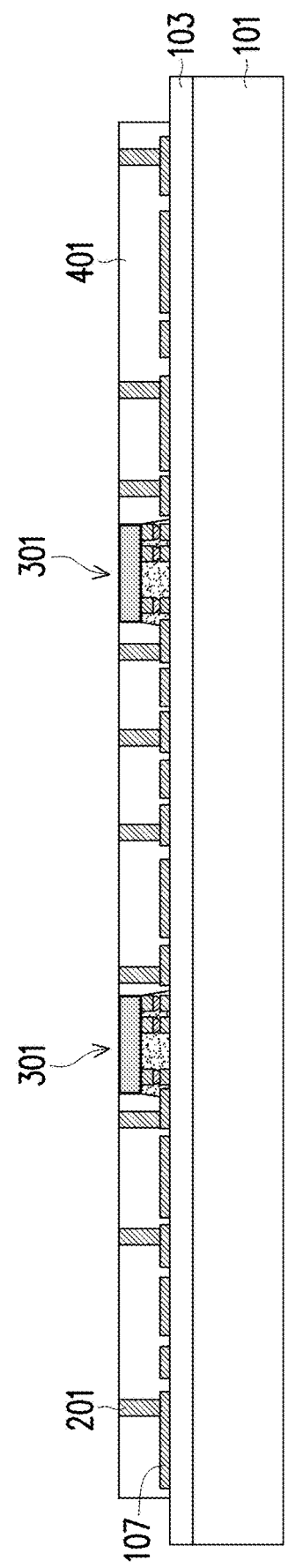

FIG. 5 illustrates a planarization process that is performed on the encapsulant 401, in accordance with some embodiments. The planarization process may be performed, e.g., using a mechanical grinding process, a chemical mechanical polishing (CMP) process, or the like. The planarization process removes excess portions of encapsulant 401 and exposes the TMVs 201. In some cases, the planarization process may also expose one or more of the interconnect devices 301. After the planarization process, the TMVs 201 and/or the interconnect devices 301 may have surfaces level with a surface of the encapsulant 401.

Figure 6:
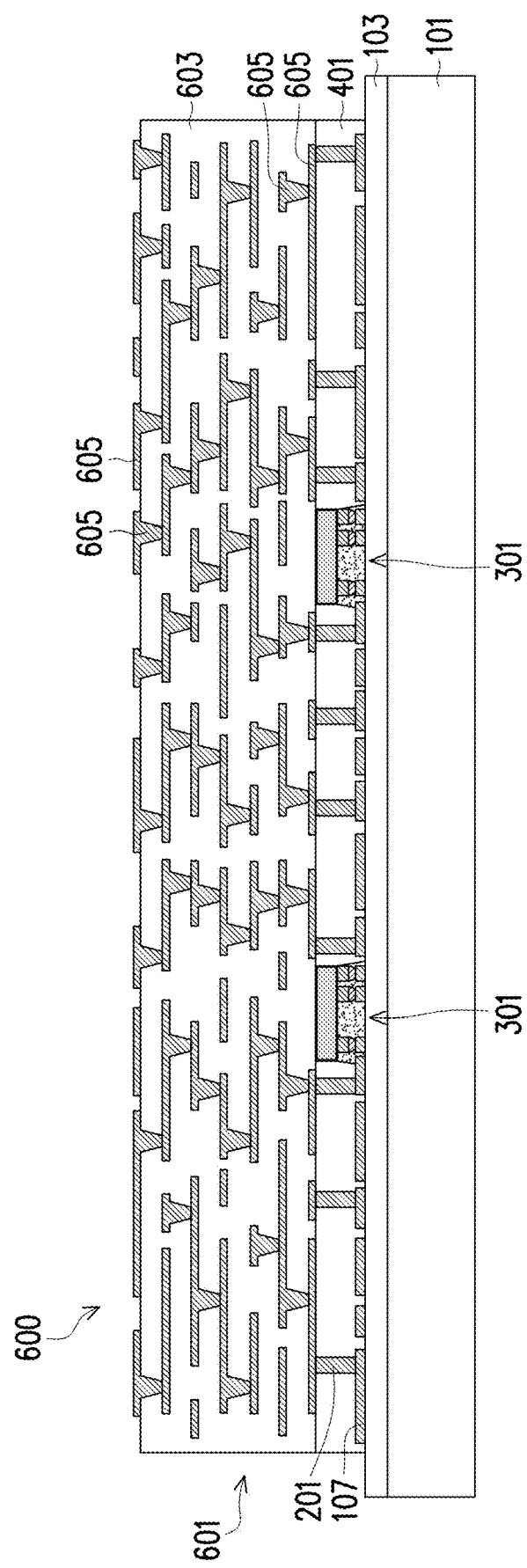

Turning to FIG. 6, this figure illustrates the formation of a redistribution structure 600 including a plurality of redistribution layers 601 formed over the interconnect devices 301, the TMVs 201, and the encapsulant 401, in accordance with some embodiments. The plurality of redistribution layers 601 makes electrical connections to the TMVs 201. In some embodiments in which the interconnect devices 301 have conductive connectors 305 on a side opposite the first carrier substrate 101, the bottommost layer of the plurality of redistribution layers 601 may make electrical connection to these conductive connectors 305. The plurality of redistribution layers 601 comprises insulation layers 603 and redistribution layers (RDLs) 605. According to some embodiments, the plurality of redistribution layers 601 may be, for example, a fan-out structure.

According to some embodiments, the plurality of redistribution layers 601 comprises six of the insulation layers 603 and seven of the RDLs 605. However, any suitable number of the insulation layers 603 and any suitable number of the RDLs 605 may be used to form the plurality of redistribution layers 601. For example, in some embodiments, the plurality of redistribution layers 601 may include between about 1 and about 15 of the insulation layers 603 and may include between about 1 and about 15 of the RDLs 605.

Still referring to FIG. 6, the plurality of redistribution layers 601 may be formed by initially forming a first layer of the RDLs 605. In an embodiment the first layer of the RDLs 605 may be formed over desired portions of underlying conductive features, TMVs 201, and/or, if present, the conductive connectors 305 located on backsides of the interconnect devices 301. The RDLs 605 may be patterned conductive layers (e.g., a metallization patterns) extending along the major surface of the underlying conductive features, TMVs 201, and/or, if present, the conductive connectors 305 located on backsides of the interconnect devices 301. According to some embodiments, the line portions of the RDLs 605 may have a critical dimension of between about 1 μm and about 100 μm, such as about 7 μm and the via portions of the RDLs 605 may have a critical dimension of between about 5 μm and about 100 μm, such as about 25 μm.

In an embodiment, the RDLs 605 may be formed by initially forming a seed layer (not shown). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a suitable formation process such as PVD, CVD, sputtering, or the like. The seed layer is formed over a present layer of the insulation layers 603, in the openings of the present layer, and over the exposed features within the openings. A photoresist (also not shown) may then be formed to cover the seed layer and then be patterned to expose those portions of the seed layer that are located where the patterned conductive layer is desired to be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form a present one of the RDLs 605. Once the conductive material has been formed, the photoresist may be removed through a suitable removal process such as an ashing process or a chemical stripping process, such as using oxygen plasma or the like. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the present one of the RDLs 605.

Once the RDLs 605 have been formed, a first layer of the insulation layers 603 is formed over the RDLs 605. According to some embodiments, the insulation layers 603 are made of one or more suitable dielectric materials such as an oxide (e.g., silicon oxide), a nitride (e.g., silicon nitride), a polymer material, a polyimide material, a low-k dielectric material, a molding material (e.g., an EMC or the like), another dielectric material, the like, or a combination thereof. The insulation layers 603 may be formed by a process such as spin-coating, lamination, CVD, the like, or a combination thereof. However, any suitable dielectric materials and any suitable processes may be used. Furthermore, some or all of the insulation layers 603 may comprise the same insulating materials and/or some of the insulation layers 603 may comprise different insulating materials from the other layers.

In some embodiments, the insulation layers 603 are formed to thicknesses of between about 1 μm and about 50 μm, such as about 5 μm, although any suitable thicknesses may be used. Once a layer of the insulation layers 603 has been formed, openings may be formed through that layer using a suitable photolithographic mask and etching process. For example, a photoresist may be formed and patterned over the insulating layer and one or more etching processes (e.g., a wet etching process or a dry etching process) are utilized to remove portions of the insulating layer. In some embodiments, the insulation layers 603 are formed of a photosensitive polymer such as PBO, polyimide, BCB, or the like, in which openings may be patterned directly using a photolithographic mask and etching process. The openings formed in the first layer of the insulation layers 603 may expose one or more of underlying conductive layers in preparation for the deposition of an overlying one of the RDLs 605 through the openings to form vias and overlying conductive lines.

Any suitable number of the insulation layers 603 and any suitable number of the RDLs 605 may then be formed one over the other to provide additional routing along with electrical connections within the plurality of redistribution layers 601. In some embodiments, the plurality of redistribution layers 601 may include different types of the insulation layers 603, such as insulating layers formed from different materials and/or different processes. In some embodiments, one or more of the insulation layers 603 may be formed of a photosensitive polymer and the other ones of the insulation layers 603 may be formed of a molding compound or encapsulant similar to the encapsulant 401. The plurality of redistribution layers 601 may have any number, combination, or arrangement of different types of the insulation layers 603. However, all of the insulation layers 603 may be the same type.

Figure 7:
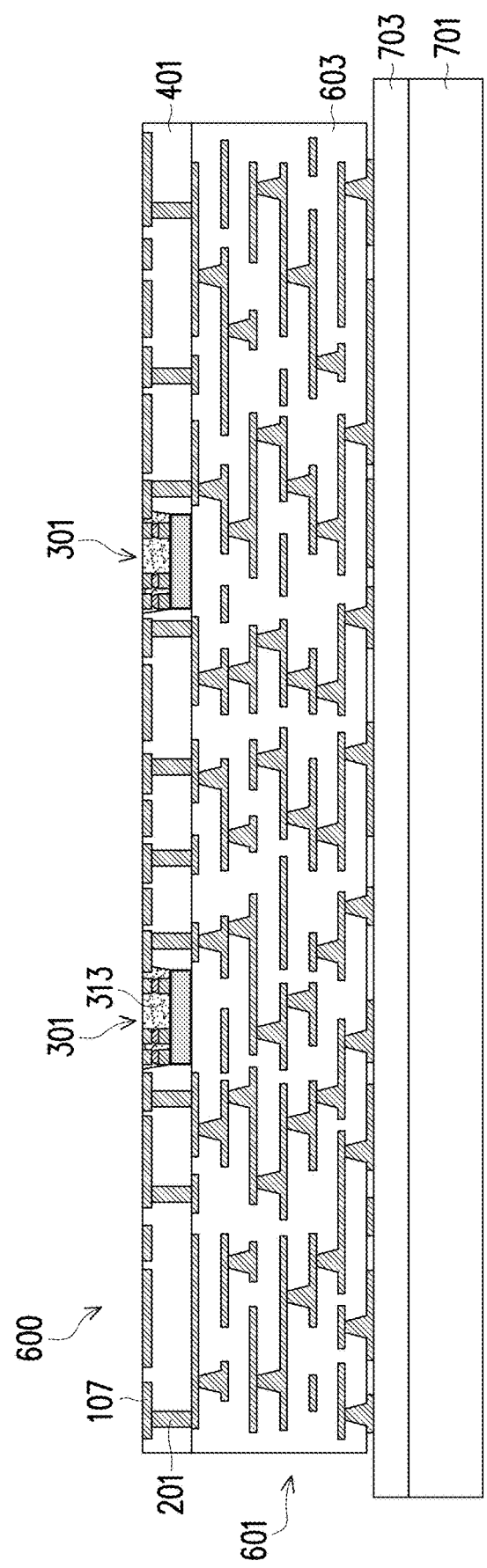

Turning to FIG. 7, this figure illustrates the de-bonding of the first carrier substrate 101 and attachment of the redistribution structure 600 to a second carrier substrate 701. According to some embodiments, once de-bonded from the first carrier substrate 101, the redistribution structure 600 is then flipped over and bonded to the second carrier substrate 701 for further processing. The de-bonding includes projecting a light such as a laser light or an UV light on the first release film 103 over the first carrier substrate 101 so that the first release film 103 decomposes under the heat of the light and the first carrier substrate 101 can be removed. A second release film 703 may be formed on the second carrier substrate 701 to facilitate attachment of the redistribution structure 600 to the second carrier substrate 701. The second carrier substrate 701 and the second release film 703, may be similar to those described above for the first carrier substrate 101, and the first release film 103.

Figure 8:
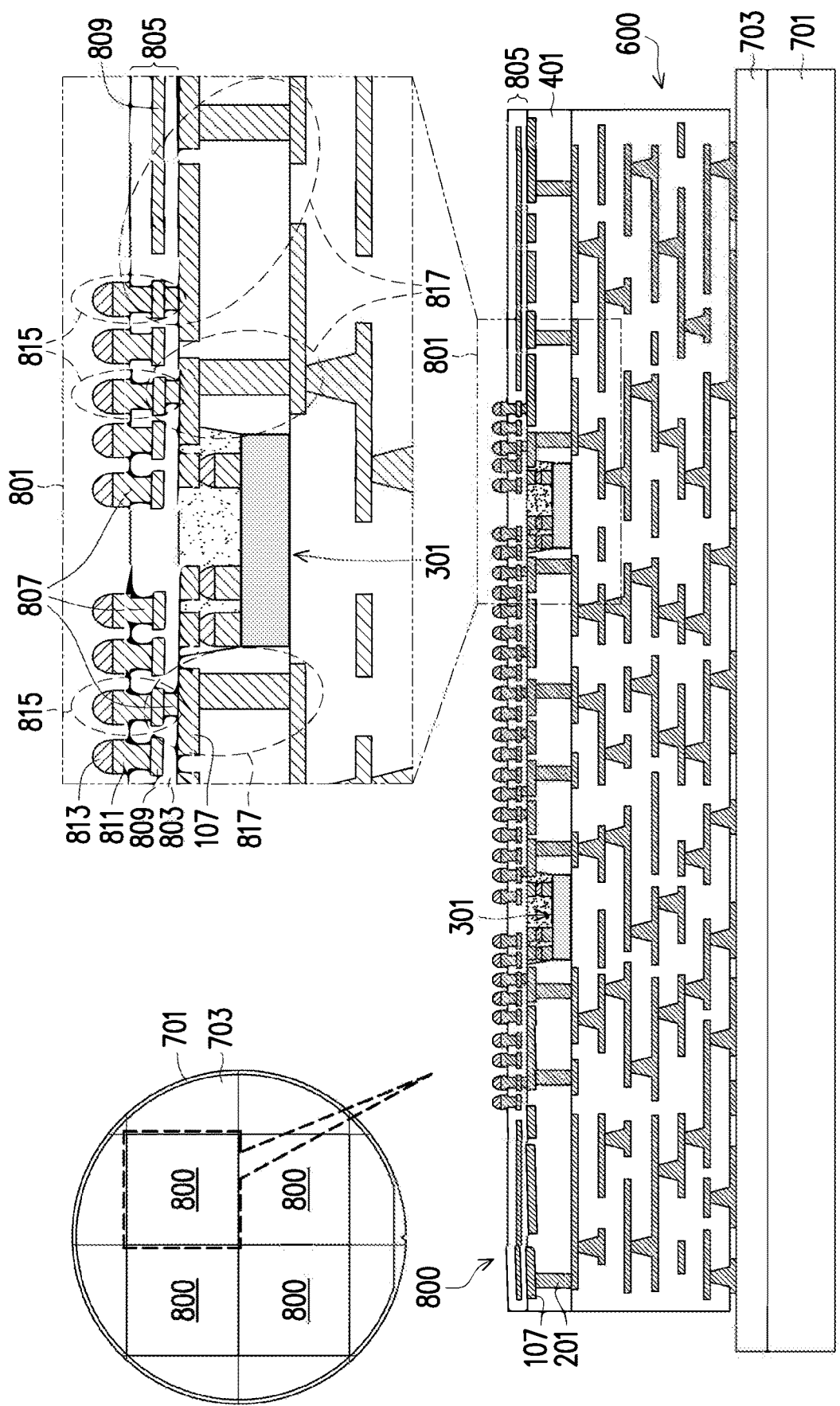

FIG. 8 illustrates a formation of a device connection structure 800 using the redistribution structure 600, according to some embodiments. FIG. 8 further illustrates, in a top down view, that a wafer forming process utilizing a circular wafer may be used to form a plurality of the device connection structures 800 and also illustrates a magnified view of a portion 801 of the device connection structure 800.

According to some embodiments, a plurality of the device connection structures 800 may be formed using wafer level processing techniques. For example, four of the device connection structures 800 may be formed over the second carrier substrate 701 in a single wafer and later singulated into the individual structures. Although an example of four of the device connection structures 800 are shown formed in the single wafer in FIG. 8, any suitable number of the device connection structures may be used.

According to some embodiments, the device connection structure 800 may be formed by initially depositing a backside protection layer 803 over the redistribution structure 600. The backside protection layer 803 may be formed using one or more suitable dielectric materials such as polybenzoxazole (PBO), a polymer material, a polyimide material, a polyimide derivative, an oxide, a nitride, a molding compound, the like, or a combination thereof. The backside protection layer 803 may be formed by spin coating, lamination, CVD, the like, or a combination thereof. In some embodiments, the backside protection layer 803 may have a thickness between about 2 µm and about 50 µm.

Once the backside protection layer 803 has been formed, openings are formed through the backside protection layer 803 to expose areas of the redistribution traces 107 in desired locations of conductive vias 807. The openings may be formed in the backside protection layer 803 by forming a photoresist over the backside protection layer 803, patterning the photoresist, and etching the backside protection layer 803 through the patterned photoresist using a suitable etching process (e.g., a wet etching process and/or a dry etching process).

The backside metallization patterns 809 may be, for example, metallization patterns comprising conductive lines, conductive traces, conductive contacts, and/or other conductive features that combine with the conductive vias 807 to electrically connect the interconnect devices 301 and the redistribution structure 600 to external devices at the backside of the device connection structure 800. In some embodiments, the backside RDL structure 805 may be formed using materials and processes similar to the RDLs 605 of the redistribution structure 600. For example, a seed layer may be formed through the openings in the backside protection layer 803, over the exposed portions of the redistribution traces 107, and over the backside protection layer 803. Once the seed layer has been formed, a photoresist may be formed and patterned on top of the seed layer in a desired pattern for the backside RDL structure 805. Conductive material may then be formed in the patterned openings of the photoresist using e.g., a plating process. The photoresist may then be removed by ashing and the exposed portions of the seed layer may be removed by etching. As such, the backside RDL structure 805 comprises a plurality of conductive vias 807 and/or backside metallization patterns 809 are formed over the backside protection layer 803. Further backside protection layers 803 and backside RDL structure 805 may be formed over one another until a desired topmost layer of the backside RDL structure 805 has been formed.

According to some embodiments, the backside RDL structure 805 comprises two of the backside protection layers 803, conductive vias 807 and a single one of the backside metallization patterns 809. In some embodiments, the conductive vias 807 in the backside RDL structure 805 may be in a stacked arrangement 815 one over the other with a backside metallization patterns 809 (e.g., contact pad, RDL pad, or the like) in between the conductive vias 807. According to some embodiments, the conductive vias 807 may have a height of between about 2 µm and about 50 µm, such as about 5 µm. Additionally, the pad between the stacked arrangements 815 may have a width that is between about 4 µm and about 40 µm, such as about 14 µm.

Furthermore, the conductive vias 807 in the backside RDL structure 805 that are adjacent the redistribution traces 107 may be in a staggered arrangement 817 with the TMVs 201 that are underlying the redistribution traces 107. For example, in such a staggered arrangement 817 the conductive vias 807 are not located over an adjacent TMVs 201 to which it is connected. Rather, the conductive vias 807 are offset from the TMVs 201 by a distance, which may be between about 5um and about 150 um, although any suitable distance may be utilized. In this manner, the backside RDL structure 805 may make electrical connections between the redistribution traces 107 to the TMVs 201 and the conductive connectors 305 of the interconnect devices 301.

Once the topmost of the backside protection layers 803 has been formed, under-bump metallizations (UBMs) 811 and external device connectors 813 are formed on the backside RDL structure 805, in accordance with some embodiments. The UBMs 811 extend through the topmost layer of the backside protection layers 803 and form electrical connections with conductive vias 807 and/or the backside metallization patterns 809. In some embodiments, the UBMs 811 may be formed by, for example, forming openings in the topmost layer of the backside protection layers 803 and then forming the conductive material of the UBMs 811 over the backside protection layers 803 and within the openings in the backside protection layers 803. In some embodiments, the openings in the backside protection layers 803 may be formed by forming a photoresist over the backside protection layer 803, patterning the photoresist, and etching the backside protection layer 803 through the patterned photoresist using a suitable etching process (e.g., a wet etching process and/or a dry etching process).

In some embodiments, the UBMs 811 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 811. Any suitable materials or layers of material that may be used for the UBMs 811 are fully intended to be included within the scope of the current application. The conductive materials of the UBMs 811 may be formed using one or more plating processes, such as electroplating or electroless plating processes, although other processes of formation, such as sputtering, evaporation, or a PECVD process, may also be used. Once the conductive materials of the UBMs 811 have been formed, portions of the conductive materials may then be removed through a suitable photolithographic masking and etching process to remove the undesired material. The remaining conductive material forms the UBMs 811. In some embodiments, the UBMs 811 may have a pitch between about 20 µm and about 80 µm.

Still referring to FIG. 8, the external device connectors 813 are formed over the UBMs 811, in accordance with some embodiments. In some embodiments, the external device connectors 813 may be ball grid array (BGA) connectors, solder balls, controlled collapse chip connection (C4) bumps, micro bumps (e.g., µbumps), electroless nickel-electroless palladium-immersion gold technique (ENEPIG) formed bumps, or the like. The external device connectors 813 may include a conductive material such as solder, copper, aluminum, gold, nickel, silver, palladium, tin, the like, or a combination thereof. In some embodiments, the external device connectors 813 is formed by initially forming a layer of solder through evaporation, electroplating, printing, solder transfer, ball placement, or the like. Once a layer of solder has been formed on the external device connectors 813, a reflow may be performed in order to shape the material into the desired shapes.

Figure 9:
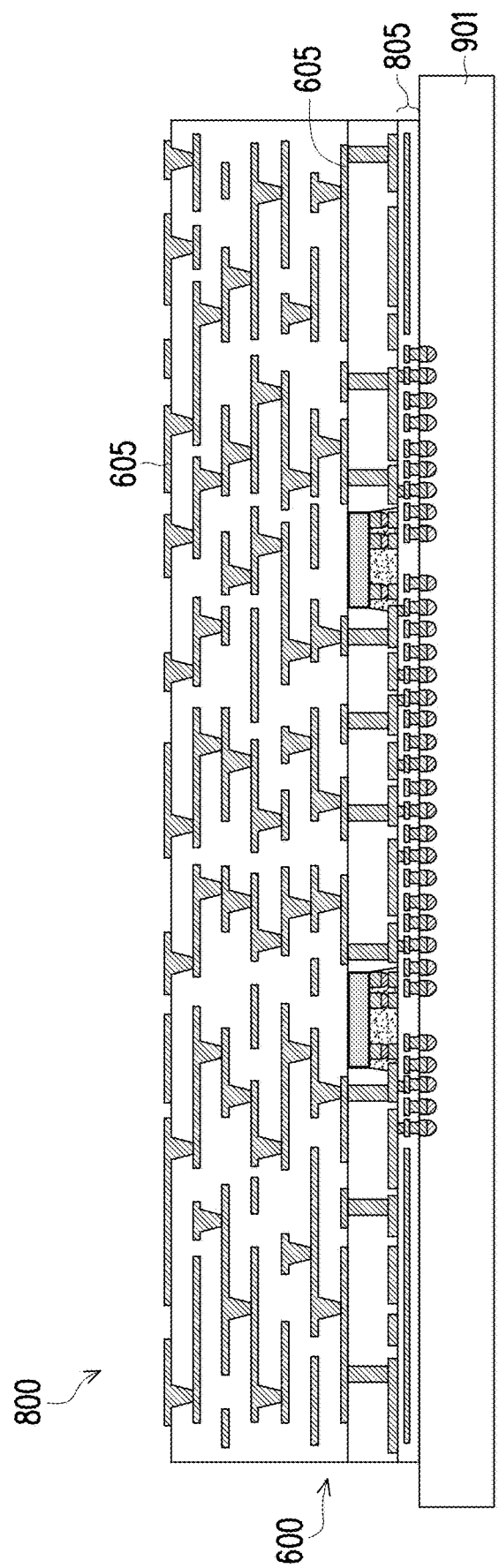
FIG. 9 illustrates a de-bonding of a carrier substrate and attachment of the device connection structure to a carrier tape, according to some embodiments.

FIG. 9 illustrates the de-bonding of the second carrier substrate 701 and attachment of the device connection structure 800 to a carrier tape 901 (e.g., a blue tape, UV film, or the like). According to some embodiments, once de-bonded from the second carrier substrate 701, the device connection structure 800 is then flipped over and bonded to the carrier tape 901 for further processing. The second carrier substrate 701 may be de-bonded similar to the processes used to remove the first carrier substrate 101. For example, the second carrier substrate 701 may be de-bonded by projecting a light on the second release film 703 so that the second release film 703 decomposes under the heat of the light and the second carrier substrate 701 can be removed. Once de-bonded, the device connection structure 800 may be flipped over and attached to the carrier tape 901. The carrier tape 901 provides both adhesion and protection for the attached surfaces of the backside RDL structure 805 and allows for further processing at the front-side of the device connection structure 800.

Figure 10:
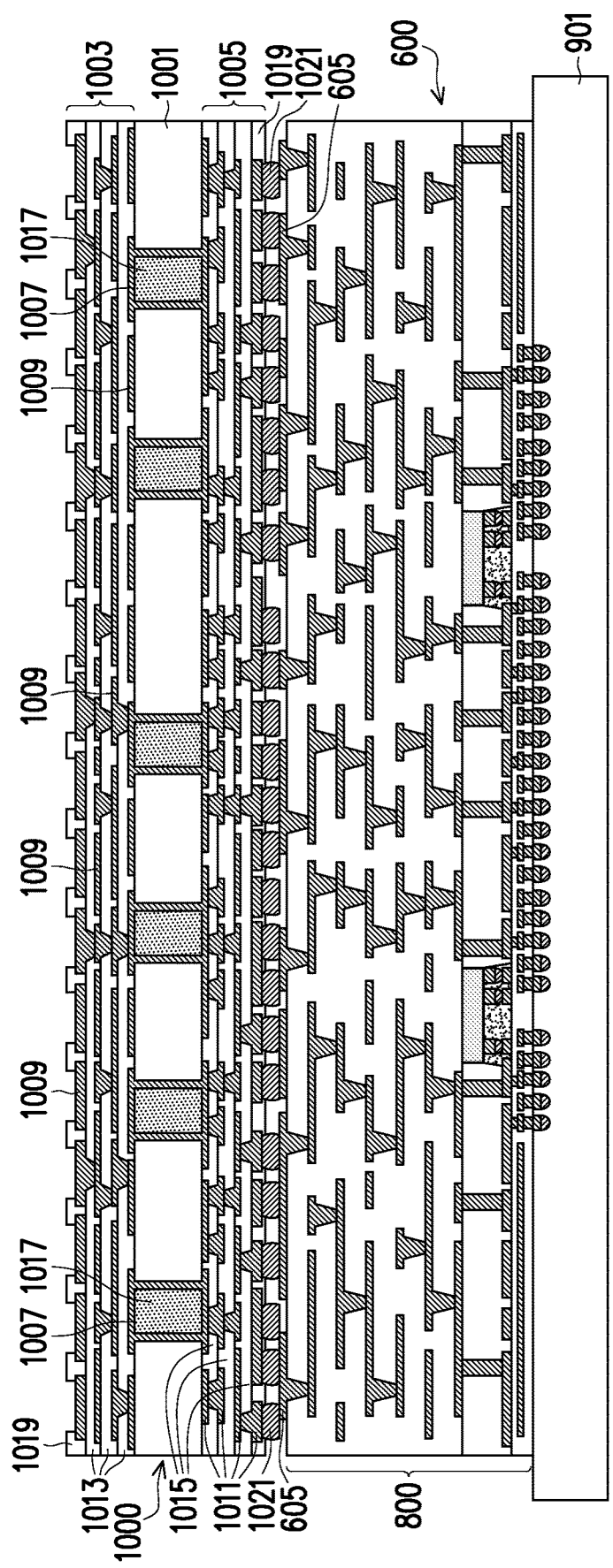
FIG. 10 illustrates the attachment of an interconnect structure to the device connection structure, in accordance with some embodiments.

FIG. 10 illustrates the attachment of an interconnect structure 1000 to the front-side of the device connection structure 800. The interconnect structure 1000 provides additional routing and stability to the device connection structure 800. For example, the interconnect structure 1000 can reduce warping of the device connection structure 800, especially for device connection structures 800 having large areas (e.g., greater than about 90 mm$^2$).

The interconnect structure 1000, in accordance with some embodiments, may be, for example, an interposer or a "semi-finished substrate," and may be free of active devices. In some embodiments, the interconnect structure 1000 includes routing layers formed on a core substrate 1001. The core substrate 1001 may include a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate 1001 may be a double-sided copper-clad laminate (CCL) substrate or the like. According to some embodiments, the core substrate 1001 may have a thickness between about 30 µm and about 2000 µm, such as about 500 µm or about 1200 µm.

The interconnect structure 1000 may have one or more routing structures 1003/1005 formed on each side of the core substrate 1001 and through vias 1007 extending through the core substrate 1001. The routing structures 1003/1005 and through vias 1007 provide additional electrical routing and interconnection. The routing structures 1003/1005 may include one or more routing layers 1009/1011 and one or more dielectric layers 1013/1015. In some embodiments, the routing layers 1009/1011 and/or through vias 1007 may comprise one or more layers of copper, nickel, aluminum, other conductive materials, the like, or a combination thereof. In some embodiments, the dielectric layers 1013/1015 may include materials such as a build-up material, ABF, a prepreg material, a laminate material, another material similar to those described above for the core substrate 1001, the like, or combinations thereof. Although embodiments in the figures illustrate the interconnect structure 1000 having two of the routing structures 1003/1005 and each of the routing structures 1003/1005 including four of the routing layers 1009/1011, the routing structures 1003/1005 may comprise more or fewer than four of the routing layers 1009/1011. According to some embodiments, one of the routing structures 1003/1005 may comprise more of the routing layers 1009/1011 than the other one of the routing structures 1003/1005.

In some embodiments, the openings in the core substrate 1001 for the through vias 1007 may be filled with a filler material 1017. The filler material 1017 may provide structural support and protection for the conductive material of the through via 1007. In some embodiments, the filler material 1017 may be a material such as a molding material, epoxy, an epoxy molding compound, a resin, materials including monomers or oligomers, such as acrylated urethanes, rubber-modified acrylated epoxy resins, or multi-functional monomers, the like, or a combination thereof. In some embodiments, the filler material 1017 may include pigments or dyes (e.g., for color), or other fillers and additives that modify rheology, improve adhesion, or affect other properties of the filler material 1017. In some embodiments, the conductive material of the through vias 1007 may completely fill the through vias 1007, omitting the filler material 1017.

In some embodiments, the interconnect structure 1000 may include a passivation layer 1019 formed over one or more sides of the interconnect structure 1000. The passivation layer 1019 may be a material such as a nitride, an oxide, a polyimide, a low-temp polyimide, a solder resist, combinations thereof, or the like. Once formed, the passivation layer 1019 may be patterned (e.g., using a suitable photo-lithographic and etching process) to expose portions of the routing layers 1009/1011 of the routing structures 1003/1005.

FIG. 10 further illustrates a placement of the interconnect structure 1000 into electrical connection with the device connection structure 800, in accordance with some embodiments. In an embodiment, the interconnect structure 1000 is placed into physical contact with external structure connectors 1021 (e.g., reflowable bumps) that have been placed on the device connection structure 800. The interconnect structure 1000 may be placed using, e.g., a pick and place process. The interconnect structure 1000 may be placed such that exposed regions of the routing layers 1009/1011 that are facing the device connection structure 800 are aligned with corresponding ones of the external structure connectors 1021 of the device connection structure 800. Once in physical contact, a reflow process may be utilized to bond the external structure connectors 1021 of the device connection structure 800 to the interconnect structure 1000. In some embodiments, the external structure connectors 1021 are formed on the interconnect structure 1000 instead of or in addition to the external structure connectors 1021 being formed on the device connection structure 800. In some embodiments, the external structure connectors 1021 are not formed on the device connection structure 800, and the interconnect structure 1000 is bonded to the device connection structure 800 using a direct bonding technique such as a thermo-compression bonding technique. However, any suitable bonding technique may be used.

Figure 11:
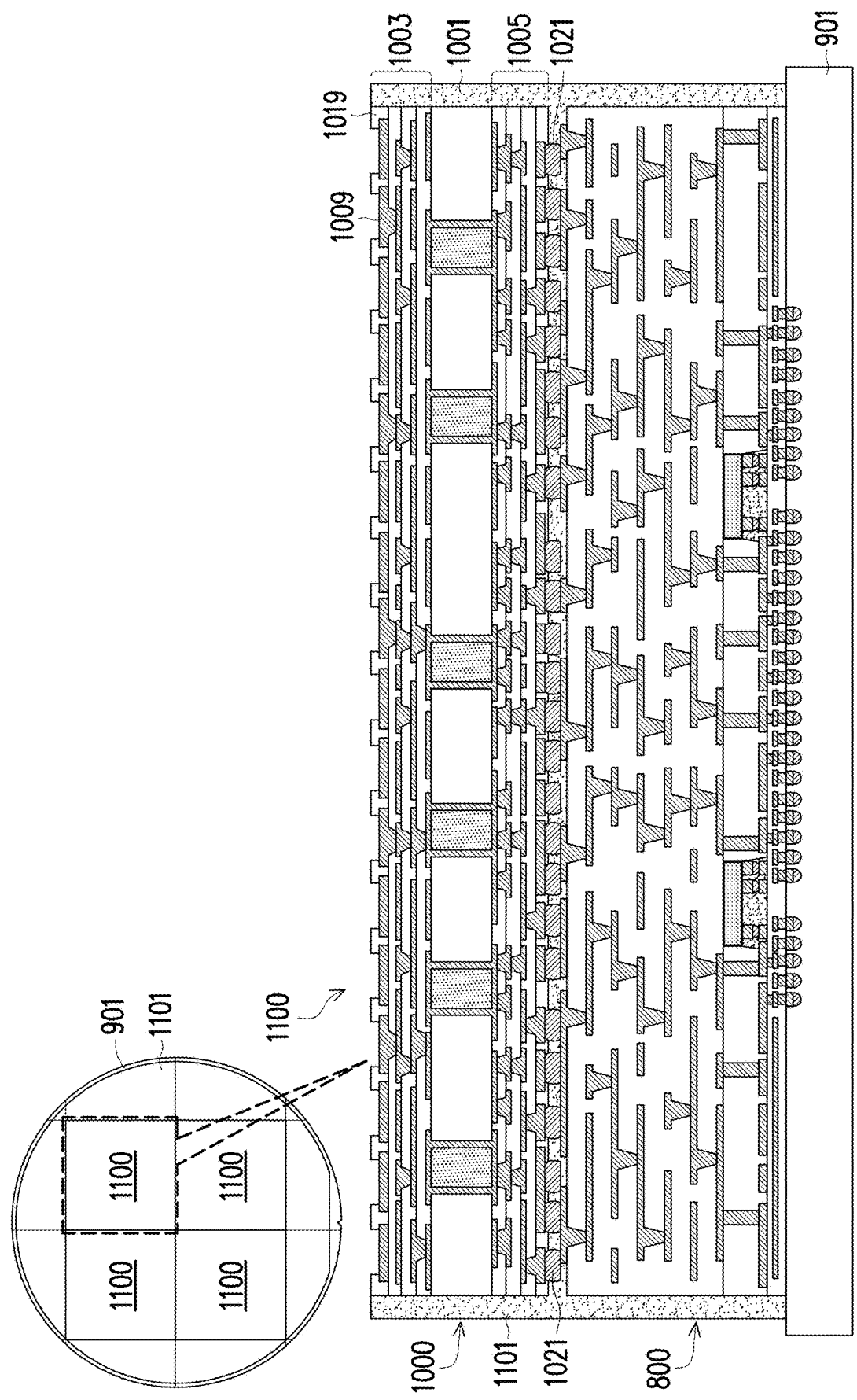
FIG. 11 illustrates a formation of a device redistribution module in wafer form using the device connection structure and the interconnect structure, according to some embodiments.

FIG. 11 illustrates a formation of a device redistribution module 1100, according to some embodiments. In some embodiments, a plurality of the device redistribution modules 1100 may be formed from the device connection structures 800 using wafer level processing techniques. For example, four of the device redistribution module 1100 may be formed over four of the device connection structures 800 in a single wafer and later singulated into the individual modules.

Once the interconnect structure 1000 has been attached, the device redistribution module 1100 may be formed by initially depositing an second underfill 1101 over the carrier tape 901, along the sidewalls of the device connection structure 800, along the sidewalls of the interconnect structure 1000, and in the gap between the interconnect structure 1000 and the device connection structure 800. The second underfill 1101 may be a material such as a molding compound, an epoxy, an underfill, a molding underfill (MUF), a resin, or the like. The second underfill 1101 can protect the external structure connectors 1021 and provide structural support for the device connection structure 800. In some embodiments, the second underfill 1101 may be cured after deposition and/or may be thinned after deposition. The thinning may be performed, e.g., using a mechanical grinding or CMP process. In some embodiments, the second underfill 1101 may be deposited over the routing structure 1003/1005 facing away from the device connection structure 800, and the thinning may expose the topmost routing layer 1009/1011 facing away from the device connection structure 800.

Figure 12:
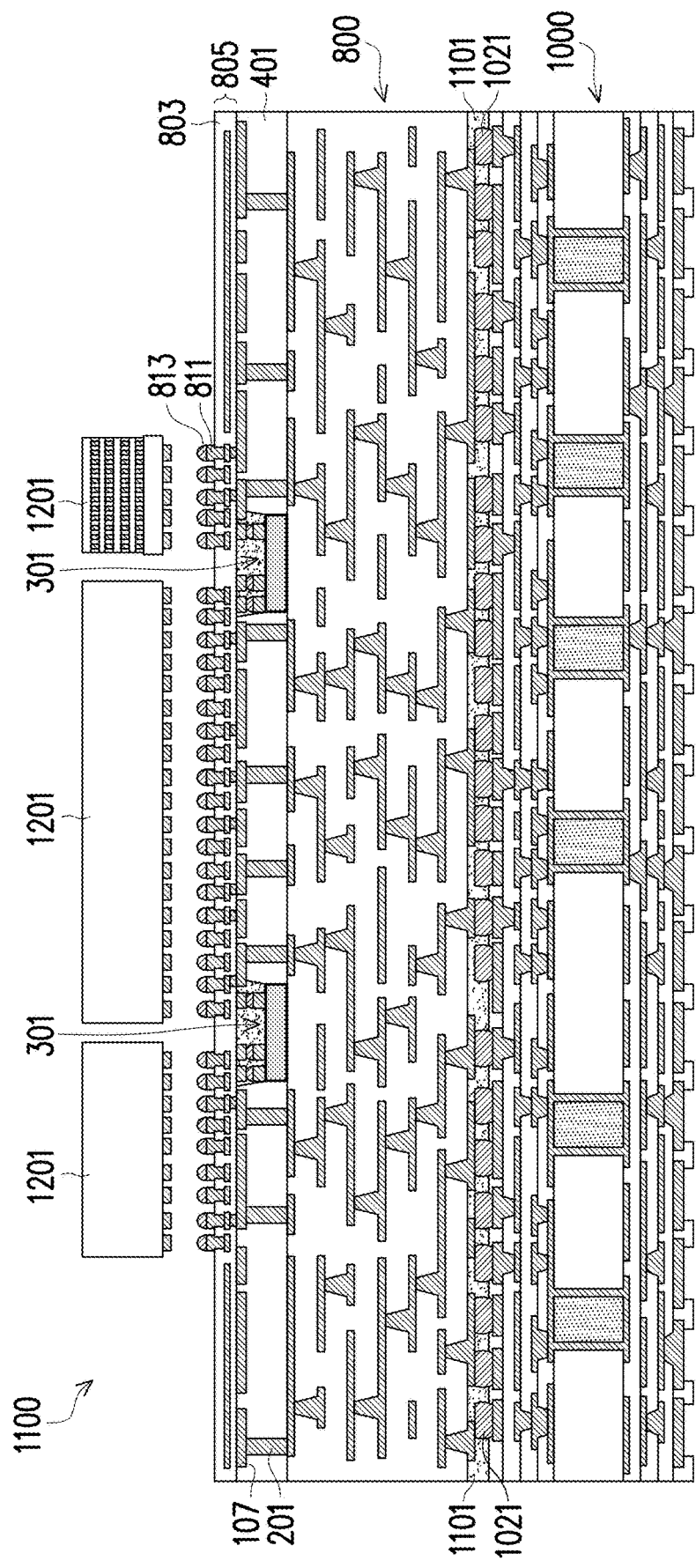
FIG. 12 illustrates a de-mounting and singulation of the wafer into a plurality of the device redistribution modules and placement of a plurality of semiconductor devices over the device redistribution module.

FIG. 12 illustrates a de-mounting of the device redistribution module 1100 from the carrier tape 901, singulation of the wafer into a plurality of the device redistribution modules 1100, and placement of a plurality of semiconductor devices 1201 over the device redistribution module 1100. Once removed from the carrier tape 901, the wafer may be flipped over and singulated (e.g., via sawing, laser drilling, etching, combinations, or the like) into a plurality of the device redistribution modules 1100.

In accordance with some embodiments, one or more of the semiconductor devices 1201 may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out (InFO) structure, a package, the like, or a combination thereof. In some embodiments, one or more of the semiconductor devices 1201 includes integrated circuit devices, such as transistors, capacitors, inductors, resistors, metallization layers, external connectors, and the like, therein, as desired for a particular functionality. Although three of the semiconductor devices 1201 are illustrated, any suitable number of the semiconductor devices 1201 may be used. For example, in some embodiments, one or two of the semiconductor devices 1201 may be attached and in other embodiments, more than three of the semiconductor devices 1201 may be attached to the external device connectors 813. In some embodiments, the semiconductor devices 1201 attached to the external device connectors 813 may include multiple semiconductor devices of the same type or may include two or more different types of semiconductor devices.

Figure 13:
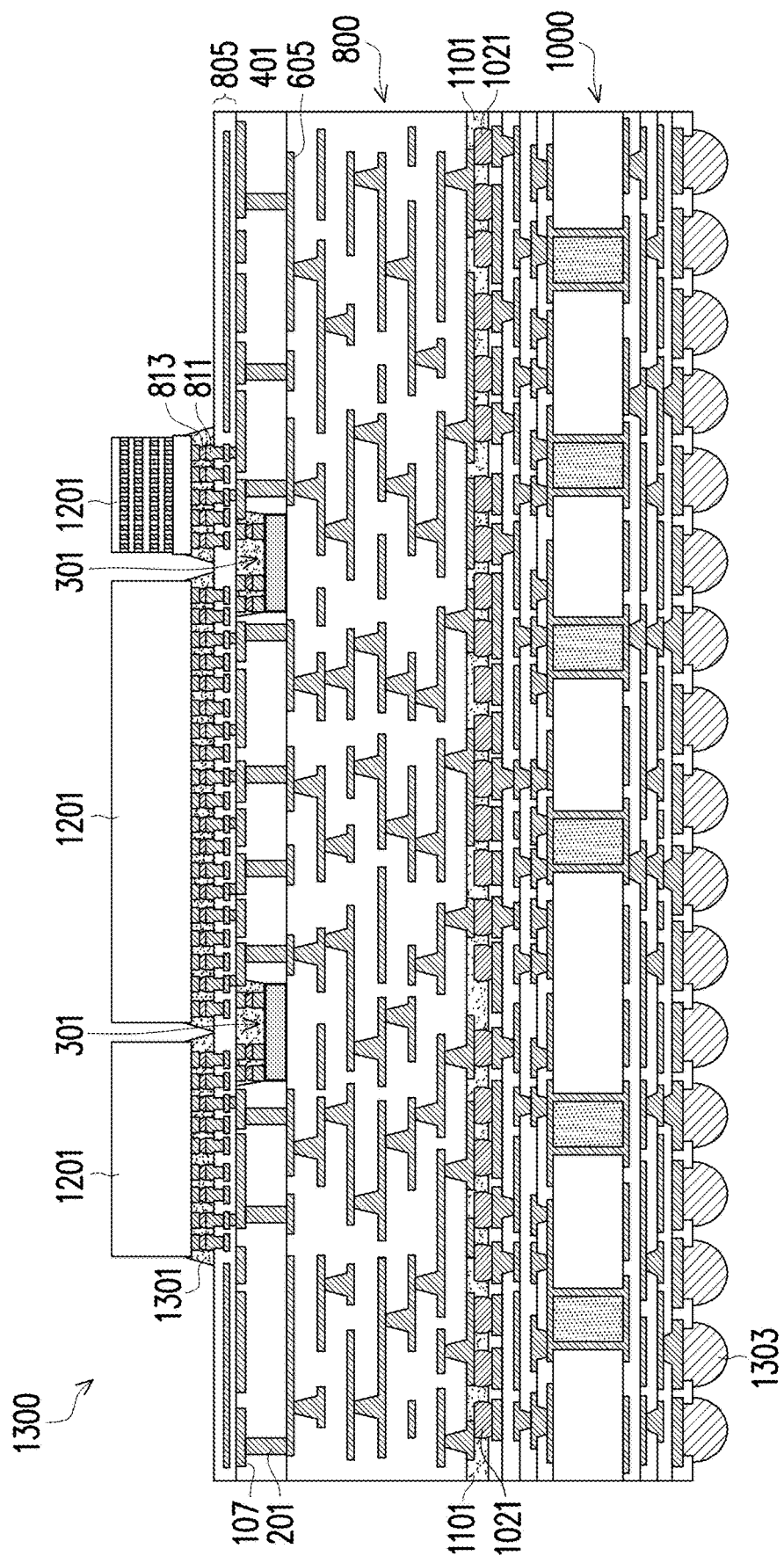
FIG. 13 illustrates a packaged device, in accordance with some embodiments.

FIG. 13 illustrates the formation of a packaged device 1300, in accordance with some embodiments. The packaged device 1300 may be formed by bonding the semiconductor devices 1201 to the external device connectors 813 and forming external package connectors 1303 to the routing layers 1009/1011 at the bottom of the packaged device 1300. According to some embodiments, the semiconductor devices 1201 are physically and electrically connected to the external structure connectors 1021 to make electrical connection between the semiconductor devices 1201 and the backside RDL structure 805. In this manner, the semiconductor devices 1201 also make electrical connection to the interconnect devices 301 and/or the TMVs 201. The semiconductor devices 1201 may be placed such that conductive regions of the semiconductor devices 1201 (e.g., contact pads, conductive connectors, solder bumps, or the like) are aligned with corresponding ones of the external device connectors 813. According to some embodiments, the semiconductor devices 1201 may be placed using a suitable process such as a pick-and-place process. However, any suitable process may be used.

Additionally, once the semiconductor devices 1201 are in physical contact with the external device connectors 813 described above with respect to FIG. 12, a reflow process may be utilized to bond the external device connectors 813 to the semiconductor devices 1201. Once bonded, a third underfill 1301 may be deposited between each of the semiconductor devices 1201 and the backside protection layer 803 according to some embodiments. The third underfill 1301 may also at least partially surround the external device connectors 813 and/or UBMs 811. The third underfill 1301 may be a material such as a molding compound, an epoxy, an underfill, a molding underfill (MUF), a resin, or the like, and may be similar to the first underfill 313 or the second underfill 1101 described previously. In some cases, the semiconductor devices 1201 are at least partially connected to each other by the interconnect devices 301 (e.g., local silicon interconnects).

Once the third underfill 1301 has been formed, the external package connectors 1303 may be formed at the front-side of the packaged device 1300. The external package connectors 1303 may be formed on exposed portions of the topmost routing layer of the interconnect structure 1000. In some embodiments, UBMs are formed on the interconnect structure 1000, and the external package connectors 1303 are formed over the UBMs. The external package connectors 1303 may be, for example, contact bumps or solder balls, although any suitable types of connectors may be utilized. In an embodiment in which the external package connectors 1303 are contact bumps, the external package connectors 1303 may include a material such as tin, or other suitable materials, such as silver, lead-free tin, or copper. In an embodiment in which the external package connectors 1303 are solder bumps, the external package connectors 1303 may be formed by initially forming a layer of solder using such a technique such as evaporation, electroplating, printing, solder transfer, ball placement, etc. Once a layer of solder has been formed on the structure, a reflow may be performed in order to shape the material into the desired bump shape for the external package connectors 1303. In some embodiments, the external package connectors 1303 may be similar to the external structure connectors 1021 described above and/or the external device connectors 813.

Figure 14:
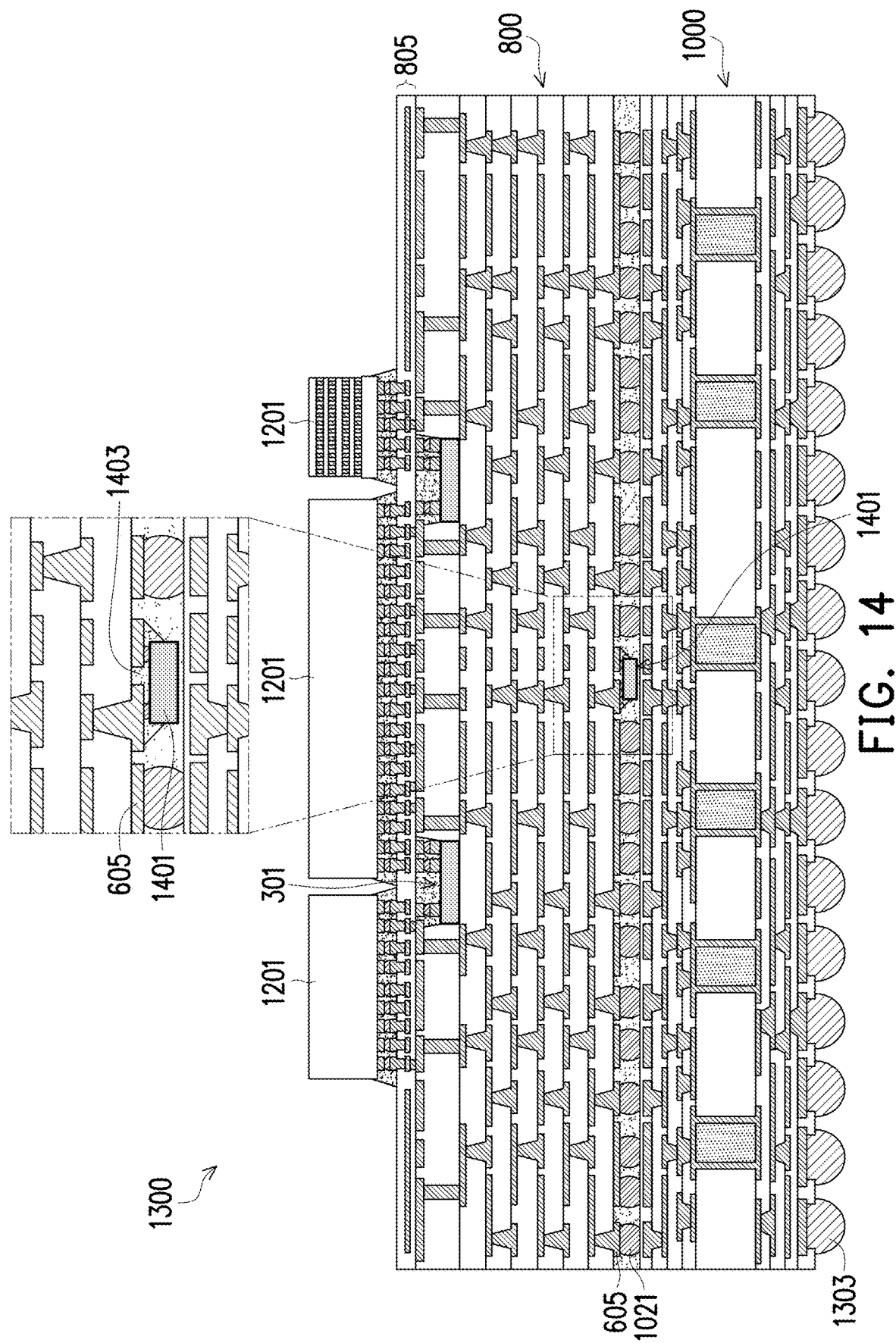
FIG. 14 illustrates the packaged device, in accordance with some other embodiments.

FIG. 14 illustrates the packaged device 1300, in accordance with some other embodiments. In this embodiment the packaged device 1300 may be formed with embedded devices 1401 attached to the front-side of the device connection structure 800 for electrical connectivity to one or more of the semiconductor devices 1201 and/or one or more of the external package connectors 1303. Examples of the embedded devices 1401 include but are not limited to devices such as integrated passive devices (IPDs) (e.g., multi-layer ceramic capacitors (MLCCs), coil inductors, film resistors, or the like). The embedded devices 1401 may comprise one or more passive devices formed within a die substrate such as, a bulk silicon, doped or undoped, or an active layer of a silicon-on-insulator (SOI) substrate. The one or more passive devices may be connected by a plurality of die metallization routing layers formed on the die substrate and are designed to connect the various devices, formed within or on the die substrate, to one another in order to form functional circuitry. The embedded devices 1401 comprise die contact pads formed in electrical contact with the die metallization routing layers for external connection to the embedded devices 1401.

The embedded devices 1401 may be attached to the device connection structure 800 prior to forming the external structure connectors 1021 to the device connection structure 800 and/or prior to attaching the interconnect structure 1000 to the RDLs 605. In some embodiments, a solder material similar to the solder material 307 formed on the interconnect devices 301, may be formed over the die contact pads of the embedded devices 1401. According to some embodiments, the embedded devices 1401 may then be placed in contact with the RDLs 605 at the front-side of the device connection structure 800 using a pick-and-place process. Once in physical contact with the RDLs 605, a reflow process may be performed to bond the solder material to the RDLs 605 and thus attach the embedded devices 1401 to the device connection structure 800.

Once the embedded devices 1401 have been attached, a fourth underfill 1403 may be formed and/or placed between the embedded devices 1401 and the device connection structure 800. The fourth underfill 1403 may be similar to the first underfill 313 or the third underfill 1301. However, any suitable underfill material may be used.

Figure 15:
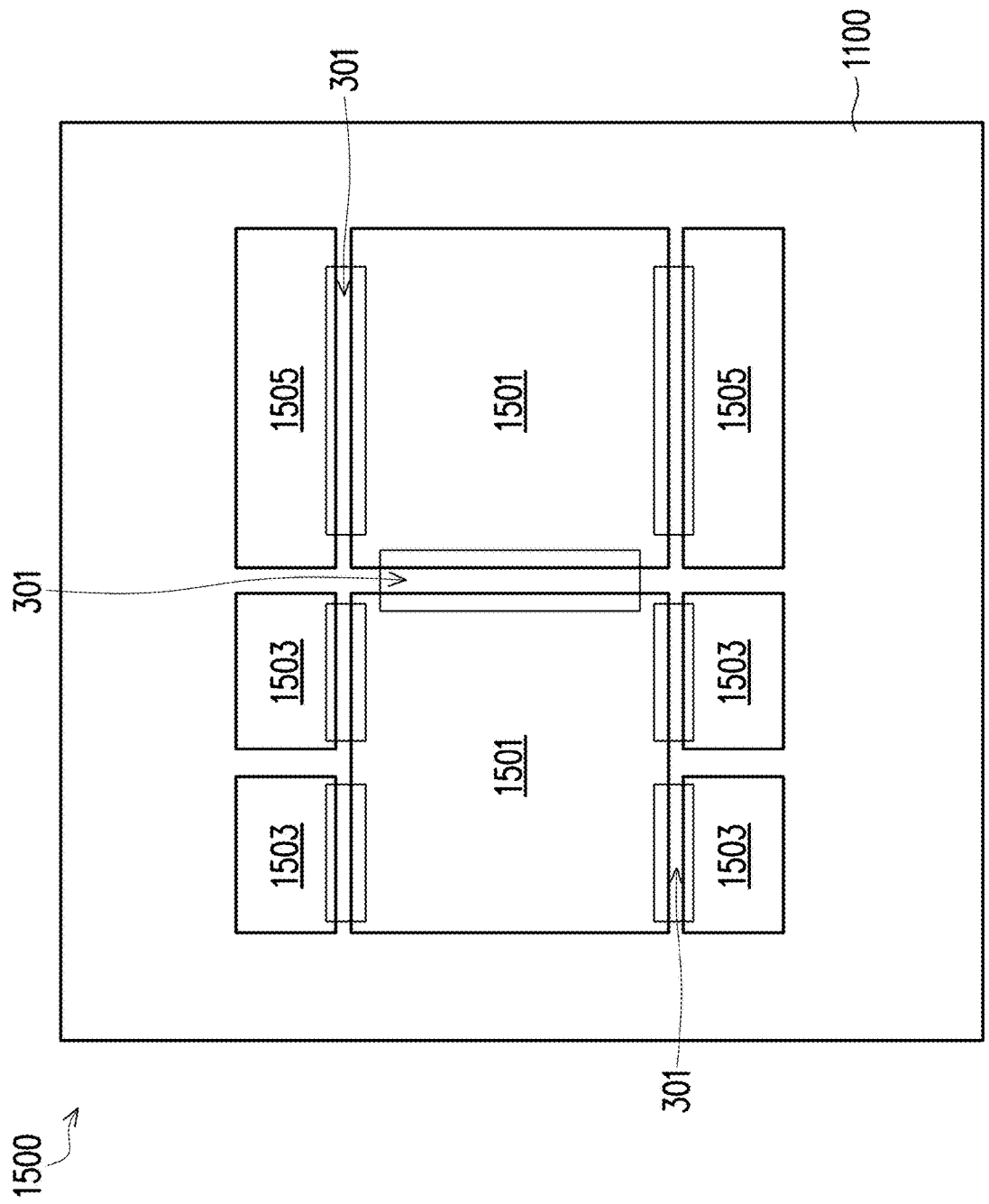
FIG. 15 illustrates a plan view of a system on integrated substrate (SoIS) package, in accordance with a particular embodiment.

FIG. 15 illustrates a plan view of a system on integrated substrate package 1500, in accordance with a particular embodiment. For example, the system on integrated substrate package 1500 includes the interconnect devices 301, first semiconductor devices 1501, second semiconductor devices 1503, and third semiconductor devices 1505. According to some embodiments, the first semiconductor devices 1501 may be processors (e.g., system-on-chip (SoC) devices), the second semiconductor devices 1503 may be memory devices (e.g., high-bandwidth memory (HBM) devices), and the third semiconductor devices 1505 may be input/output devices (e.g., I/O chips). Some features of the packaged device 1300 described above may be omitted for clarity. The interconnect devices 301 may be located in regions between adjacent semiconductor devices. In this manner, the interconnect devices 301 are configured to provide electrical connections between the adjacent semiconductor devices.

However, while a particular system utilizing an SoC devices, HBM devices, and I/O chips is described with respect to FIG. 14, this description is merely one embodiment that is meant to be illustrative and is not intended to be limiting. Rather, any suitable combination of devices and functionalities, with any suitable types of chips or devices, may be utilized, and all such combinations are fully intended to be included within the scope of the embodiments. Additionally, the system on integrated substrate package 1500 is an illustrative example, and the first semiconductor devices 1501, the second semiconductor devices 1503, the third semiconductor devices 1505, and/or the interconnect devices 301 may have different sizes, shapes, arrangements, or configurations than shown or be present in different numbers than shown.

Figure 16:
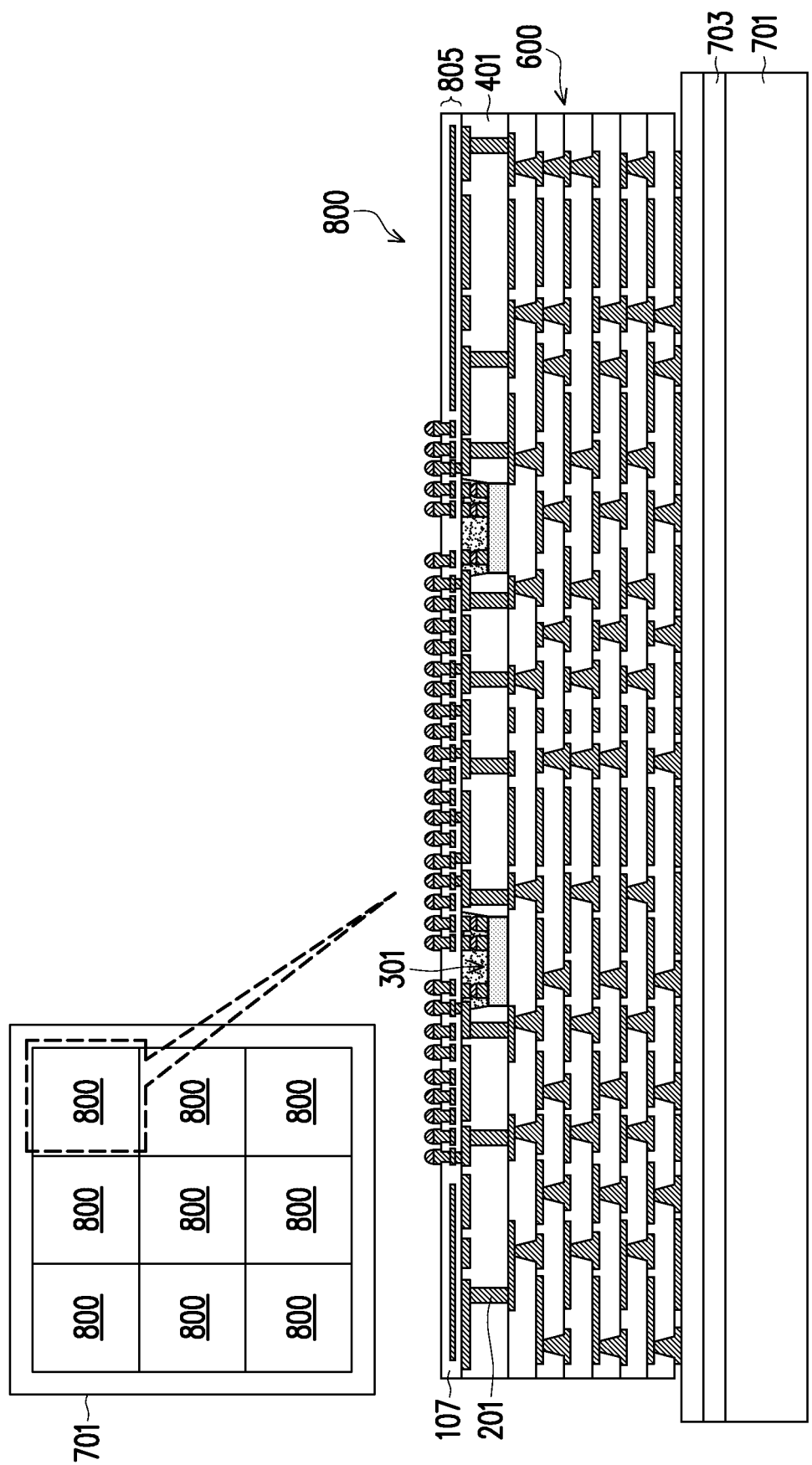
FIG. 16 illustrates a formation of the device connection structure in panel form, according to some embodiments.

FIG. 16 shows an embodiment in which the second carrier substrate 701 is a panel structure. According to some embodiments, a plurality of the device connection structures 800 is formed on the second carrier substrate 701. In some embodiments, nine of the device connection structures 800 may be formed in the panel structure. Once formed, the panel structure may be further processed and subsequently singulated into a plurality of the interconnect structures 1000. Once singulated, the interconnect structures 1000 may be further processed into a plurality of the packaged devices 1300. In some embodiments, the panel structure may be singulated into a plurality of the device connection structures 800 and further processed into a plurality of the packaged devices 1300.

By forming the interconnect devices 301 such that they are embedded in a layer of the device connection structure 800 close to the semiconductor devices 1201 as described herein, the routing distances of connections between the semiconductor devices 1201 may be reduced, which can increase the bandwidth or speed of electrical signals communicated between the semiconductor devices 1201, improving high-speed operation for example in between chip to chip or chip to memory systems. Additionally, the greater routing density available in the interconnect devices 301 can provide more efficient routing between semiconductor devices 1201, and in some cases can reduce the number of redistribution layers 601 used in the device connection structure 800 or the number of routing layers 1009/1011 used in the interconnect structure 1000. In some cases, the integrity or stability of the power supplied to the semiconductor devices 1201 may be improved by connecting the semiconductor devices 1201 to the backside metallization patterns 809 through the backside protection layers 803 that is relatively thin (e.g., compared to the insulation layers 603 of the plurality of redistribution layers 601, for instance). Furthermore, the two or more backside protection layers 803 and the staggered via design between the conductive vias 807 in the backside RDL structure 805 and the TMVs 201 provides excellent reliability margins for example in applications such as system on integrated substrate packages.

Additionally, in some cases, attaching the semiconductor devices 1201 to the device connection structure 800 rather than to an interconnect structure (e.g., interconnect structure 1000, an organic core substrate, substrate with additional routing, or the like) can reduce warpage, for example, due to coefficient of thermal expansion (CTE) mismatch. The use of interconnect devices 301 to interconnect the semiconductor devices 1201 rather than interconnecting the semiconductor devices 1201 using another separate interconnect structure allows the semiconductor devices 1201 to be directly attached to the device connection structure 800, which can reduce the overall size of the packaged device 1300 as well as reduce warping. The use of the interconnect devices 301 can also provide electrical routing with reduced warping due to improved CTE matching with the semiconductor devices 1201. This can reduce the risk of contact fatigue issues for electrical connections to the semiconductor devices 1201, particularly for semiconductor devices 1201 or packages having larger areas. Reducing warping can also reduce alignment mismatch when attaching the semiconductor devices 1201. Furthermore, in some embodiments, one or more of the interconnect devices 301 may be provided as an integrated voltage regulator (IVR) and/or an integrated passive device (IPD) which allows for applications such as System-in-Packages (SiPs) to be integrated into the device connection structure 800.

The embodiments disclosed herein can meet super high bandwidth requirements for high performance computing (HPC) applications combined with system on integrated substrate (SoIS) solutions. As such, excellent electrical performance such as, signal integrity and power integrity is achievable in a low cost packaged device. For example, in application using high speed serial/de-serial (Ser/Des) transmission protocols, these signals can be transmitted with excellent signal integrity and low skin effect impact due to low dissipation factor (Df) of less than or equal to 0.01 of the dielectric materials and low conductor roughness (Ra of less than or equal to 0.1 μm) of the interconnect devices. Furthermore, implementation of thin layers for the backside protection layers 803 with a low R/L ratio with embedded IPDs contribute to a premium power integrity design with few power plan layers which also helps with CPI immunity.

As such, the packaged devices 1300 may be used in advanced networking and server applications (e.g., AI (Artificial Intelligence)) which operate with high data rates, high bandwidth demands and low latency. Furthermore, the packaged devices 1300 may be provided a high degree of chip package integration in a small form factor with high component and board level reliability. Further still, with wafer level techniques used during fabrication in a silicon fabrication environment increases package reliability with high yields may be achieved.

According to an embodiment, a method includes forming a first redistribution layer over a carrier; attaching a first interconnect device to the first redistribution layer; forming first through vias over the first redistribution layer; embedding the first through vias and the first interconnect device in a molding compound; forming a second redistribution layer over the first interconnect device, the first through vias, and the molding compound, the first through vias being electrically coupled to the second redistribution layer; forming a third redistribution layer adjacent the first redistribution layer opposite the first interconnect device, the first through vias, and the molding compound; forming a first external device contact on the third redistribution layer; and forming a second external device contact on the third redistribution layer, the first interconnect device electrically coupling the first external device contact to the second external device contact. In an embodiment of the method, wherein forming the third redistribution layer includes: forming a first protection layer over the first redistribution layer; forming a first conductive via through the first protection layer and in physical contact with the first redistribution layer; forming a redistribution pad over the first conductive via; forming a second protection layer over the first conductive via and the first protection layer; and forming a second conductive via through the second protection layer and in contact with the redistribution pad, the second conductive via electrically coupling the first external device contact to the redistribution pad. In an embodiment of the method, the first conductive via and the second conductive via are in a stacked arrangement. In an embodiment of the method, the second conductive via is electrically connected to one of the first through vias and wherein the second conductive via and the one of the first through vias are in a staggered arrangement. In an embodiment, the method further includes: mounting a first semiconductor device to the first external device contact; and mounting a second semiconductor device to the second external device contact, the first semiconductor device being different from the second semiconductor device. In an embodiment, the method further includes: mounting an interposer to the second redistribution layer; and forming a first external connector on the interposer opposite the second redistribution layer, the first external connector being electrically coupled to the second redistribution layer. In an embodiment, the method further includes: forming a third external device connector over the third redistribution layer, wherein the third external device connector is electrically coupled to the first external connector.

According to an embodiment, a method includes: forming a first contact pad over a carrier; forming a first conductive line over the carrier; mounting a local interconnect to the first contact pad; forming a through molding via over the first conductive line; encapsulating the through molding via and the local interconnect in a molding compound; forming a first redistribution structure over the local interconnect, the through molding via, and the molding compound, the first redistribution structure being electrically coupled to the through molding via; forming a second redistribution structure adjacent the first contact pad and the first conductive line opposite the local interconnect, the through molding via, and the molding compound; forming a first external contact and a second external contact over the second redistribution structure, the local interconnect electrically coupling the first external contact to the second external contact; connecting an interconnect structure over and electrically coupled to the first redistribution structure; and forming a first external package connector over the interconnect structure opposite the first redistribution structure, the first external package connector being electrically coupled to the first redistribution structure. In an embodiment, the forming the second redistribution structure includes: forming a first dielectric layer over the first contact pad and the first conductive line opposite the local interconnect; forming a first conductive via through the first dielectric layer and in contact with the first contact pad; forming a second conductive via through the first dielectric layer and on the first conductive line; forming a second conductive line over the first conductive via; forming a second dielectric layer over the second conductive line and the first dielectric layer; and forming a third conductive via through the second dielectric layer and on the second conductive line, the third conductive via electrically coupling the first external contact to the second conductive line. In an embodiment of the method, the first conductive via and the third conductive via are in a stacked arrangement. In an embodiment, the second conductive via and the through molding via are in a staggered arrangement. In an embodiment of the method, the local interconnect is a local silicon interconnect. In an embodiment, the method further includes bonding a system on chip device to the first external contact; and bonding a high bandwidth memory stack to the second external contact, the system on chip device being electrically coupled to the high bandwidth memory stack through the local interconnect. In an embodiment, the method further includes forming a third external contact over the second redistribution structure, wherein the third external contact is electrically coupled to the first external package connector.

According to an embodiment, a semiconductor device includes: a first interconnect device attached to a first redistribution layer; a molding compound embedding the first interconnect device; first through vias extending from a first side of the molding compound to a second side of the molding compound opposite the first side of the molding compound; a second redistribution layer on the first interconnect device, the first through vias, and the molding compound, the first through vias being electrically coupled to the second redistribution layer; a third redistribution layer adjacent the first redistribution layer opposite the first interconnect device, the first through vias, and the molding compound; and multiple external device contacts adjacent to the third redistribution layer, wherein the first interconnect device electrically couples a first one of the multiple external device contacts to a second one of the multiple external device contacts. In an embodiment, the semiconductor device further includes: a first semiconductor die electrically coupled to the first one of the multiple external device contacts; and a second semiconductor die electrically coupled to the second one of the multiple external device contacts. In an embodiment, the semiconductor device further includes: an interconnect structure mounted to the second redistribution layer, the interconnect structure including a first routing layer on a first side of the interconnect structure that is electrically coupled to a second routing layer on a second side of the interconnect structure. In an embodiment, the semiconductor device further includes an underfill material adjacent to each of the interconnect structure, the second redistribution layer, the molding compound, and the third redistribution layer. In an embodiment of the semiconductor device, the first interconnect device is a local silicon interconnect. In an embodiment of the semiconductor device, the first interconnect device is an integrated passive device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first redistribution layer over a carrier;
    attaching a first interconnect device to the first redistribution layer;
    forming first through vias over the first redistribution layer;
    embedding the first through vias and the first interconnect device in a molding compound, wherein after the embedding a physical interface between the first through vias and the first redistribution layer is located within the molding compound;
    forming a second redistribution layer over the first interconnect device, the first through vias, and the molding compound, the first through vias being electrically coupled to the second redistribution layer;
    forming a third redistribution layer adjacent the first redistribution layer opposite the first interconnect device, the first through vias, and the molding compound;
    forming a first external device contact on the third redistribution layer; and
    forming a second external device contact on the third redistribution layer, the first interconnect device electrically coupling the first external device contact to the second external device contact.

2. The method of claim 1, wherein forming the third redistribution layer comprises:
    forming a first protection layer over the first redistribution layer;
    forming a first conductive via through the first protection layer and in physical contact with the first redistribution layer;
    forming a redistribution pad over the first conductive via;
    forming a second protection layer over the first conductive via and the first protection layer; and
    forming a second conductive via through the second protection layer and in contact with the redistribution pad, the second conductive via electrically coupling the first external device contact to the redistribution pad.

3. The method of claim 2, wherein the first conductive via and the second conductive via are in a stacked arrangement, wherein the forming the first redistribution layer comprises forming a first contact pad over the carrier and forming a first conductive line over the carrier, wherein the attaching the first interconnect device comprises mounting the first interconnect device to the first contact pad, and wherein the method further comprises:
    connecting an interconnect structure over and electrically coupled to the second redistribution layer; and
    forming a first external package connector over the interconnect structure opposite the second redistribution layer, the first external package connector being electrically coupled to the second redistribution layer.

4. The method of claim 3, wherein the second conductive via is electrically connected to one of the first through vias and wherein the second conductive via and the one of the first through vias are in a staggered arrangement.

5. The method of claim 1, further comprising:
    mounting a first semiconductor device to the first external device contact; and
    mounting a second semiconductor device to the second external device contact, the first semiconductor device being different from the second semiconductor device.

6. The method of claim 5, further comprising:
    mounting an interposer to the second redistribution layer; and
    forming a first external connector on the interposer opposite the second redistribution layer, the first external connector being electrically coupled to the second redistribution layer.

7. The method of claim 6, further comprising:
    forming a third external device connector over the third redistribution layer, wherein the third external device connector is electrically coupled to the first external connector.

8. A method, comprising:
    forming a first contact pad over a carrier;
    forming a first conductive line over the carrier;
    mounting a local interconnect to the first contact pad, wherein the mounting the local interconnect to the first contact pad comprises depositing an underfill material between the local interconnect and the carrier, wherein the underfill material is in direct physical contact with the first conductive line;
    forming a through molding via over the first conductive line;
    encapsulating the through molding via, the underfill material, and the local interconnect in a molding compound;
    forming a first redistribution structure over the local interconnect, the through molding via, and the molding compound, the first redistribution structure being electrically coupled to the through molding via;
    forming a second redistribution structure adjacent the first contact pad and the first conductive line opposite the local interconnect, the through molding via, and the molding compound;
    forming a first external contact and a second external contact over the second redistribution structure, the local interconnect electrically coupling the first external contact to the second external contact;
    connecting an interconnect structure over and electrically coupled to the first redistribution structure; and
    forming a first external package connector over the interconnect structure opposite the first redistribution structure, the first external package connector being electrically coupled to the first redistribution structure.

9. The method of claim 8, wherein forming the second redistribution structure comprises:
forming a first dielectric layer over the first contact pad and the first conductive line opposite the local interconnect;
forming a first conductive via through the first dielectric layer and in contact with the first contact pad;
forming a second conductive via through the first dielectric layer and on the first conductive line;
forming a second conductive line over the first conductive via;
forming a second dielectric layer over the second conductive line and the first dielectric layer; and
forming a third conductive via through the second dielectric layer and on the second conductive line, the third conductive via electrically coupling the first external contact to the second conductive line.

10. The method of claim 9, wherein the first conductive via and the third conductive via are in a stacked arrangement.

11. The method of claim 9, wherein the second conductive via and the through molding via are in a staggered arrangement.

12. The method of claim 8, wherein the local interconnect is a local silicon interconnect, wherein the mounting the local interconnect to the first contact pad comprises attaching the local interconnect to a first redistribution layer, the first redistribution layer comprising the first contact pad, and wherein the forming the second redistribution structure comprises forming a second redistribution layer adjacent to the first redistribution layer opposite the local interconnect, the through molding via, and the molding compound.

13. The method of claim 8, further comprising:
bonding a system on chip device to the first external contact; and
bonding a high bandwidth memory stack to the second external contact, the system on chip device being electrically coupled to the high bandwidth memory stack through the local interconnect.

14. The method of claim 13, further comprising:
forming a third external contact over the second redistribution structure, wherein the third external contact is electrically coupled to the first external package connector.

15. A semiconductor device comprising:
a first interconnect device attached to a first redistribution layer, wherein the first redistribution layer has a first top surface and a first bottom surface;
a molding compound embedding the first interconnect device, wherein the molding compound has a second top surface and a second bottom surface;
first through vias extending from the first bottom surface to the second bottom surface, wherein the first through vias are in direct physical contact with the first redistribution layer;
a second redistribution layer on the first interconnect device, the first through vias, and the molding compound, the first through vias being electrically coupled to the second redistribution layer;
a third redistribution layer adjacent the first redistribution layer opposite the first interconnect device, the first through vias, and the molding compound, wherein the third redistribution layer has a planar interface with the first top surface and the second top surface; and
multiple external device contacts adjacent to the third redistribution layer, wherein the first interconnect device electrically couples a first one of the multiple external device contacts to a second one of the multiple external device contacts.

16. The semiconductor device of claim 15, further comprising:
a first semiconductor die electrically coupled to the first one of the multiple external device contacts; and
a second semiconductor die electrically coupled to the second one of the multiple external device contacts.

17. The semiconductor device of claim 16, further comprising:
an interconnect structure mounted to the second redistribution layer, the interconnect structure comprising a first routing layer on a first side of the interconnect structure that is electrically coupled to a second routing layer on a second side of the interconnect structure.

18. The semiconductor device of claim 17, further comprising an underfill material adjacent to each of the interconnect structure, the second redistribution layer, the molding compound, and the third redistribution layer.

19. The semiconductor device of claim 15, wherein the first interconnect device is a local silicon interconnect.

20. The semiconductor device of claim 15, wherein the first interconnect device is an integrated passive device.

* * * * *